(12) United States Patent
Daubenspeck et al.

(10) Patent No.: US 6,835,973 B2
(45) Date of Patent: Dec. 28, 2004

(54) ANTIFUSE FOR USE WITH LOW κ DIELECTRIC FOAM INSULATORS

(75) Inventors: Timothy H. Daubenspeck, Colchester, VT (US); William A. Klaasen, Underhill, VT (US); William T. Motsiff, Essex Junction, VT (US); Rosemary A. Previti-Kelly, Burlington, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 10/159,573

(22) Filed: May 31, 2002

(65) Prior Publication Data

US 2002/0182837 A1 Dec. 5, 2002

Related U.S. Application Data

(62) Division of application No. 09/417,853, filed on Oct. 14, 1999, now Pat. No. 6,458,630.

(51) Int. Cl.$^7$ ................................ H01L 27/10
(52) U.S. Cl. ................ 257/209; 257/211; 257/758
(58) Field of Search ................. 257/209, 211, 257/758

(56) References Cited

U.S. PATENT DOCUMENTS

| | | |
|---|---|---|
| 4,590,258 A | 5/1986 | Linde et al. |
| 5,115,095 A | 5/1992 | Babich et al. |
| 5,130,392 A | 7/1992 | Schwalm et al. |
| 5,202,061 A | 4/1993 | Angelopoulos et al. |
| 5,376,502 A | 12/1994 | Novak et al. |
| 5,420,455 A | 5/1995 | Gilmour et al. |
| 5,463,014 A | 10/1995 | Epstein et al. |
| 5,523,253 A | 6/1996 | Gilmour et al. |
| 5,591,285 A | 1/1997 | Afzali-Ardakani et al. |
| 5,608,257 A | 3/1997 | Lee et al. |
| 5,654,564 A * | 8/1997 | Mohsen ................ 257/209 |
| 5,663,702 A | 9/1997 | Shaw, Jr. et al. |
| 5,705,849 A | 1/1998 | Zheng et al. |
| 5,777,540 A | 7/1998 | Dedert et al. |
| 5,795,819 A | 8/1998 | Motsiff et al. |
| 5,811,869 A | 9/1998 | Seyyedy et al. |
| 5,834,824 A | 11/1998 | Shepherd et al. |
| 5,852,323 A | 12/1998 | Conn |
| 5,855,755 A | 1/1999 | Murphy et al. |
| 6,458,630 B1 * | 10/2002 | Daubenspeck et al. ..... 438/131 |

\* cited by examiner

*Primary Examiner*—Long Pham
(74) *Attorney, Agent, or Firm*—DeLio & Peterson, LLC; Kelly M. Reynolds; William D. Sabo

(57) ABSTRACT

A fusible link for a semiconductor device comprises an insulating substrate and a conductive line pair on the surface of the insulating substrate, with the conductive line pair having spaced ends. A polymer is disposed over the insulating substrate and between the conductive line pair ends. The polymer is capable of being changed from a non-conductive to a conductive state upon exposure to an energy beam. Preferably, the polymer comprises a polyimide, more preferably, a polymer/onium salt mixture, most preferably, a polyaniline polymer doped with a triphenylsufonium salt. The link may further comprise a low κ nanopore/nanofoam dielectric material adjacent the conductive line ends.

18 Claims, 4 Drawing Sheets

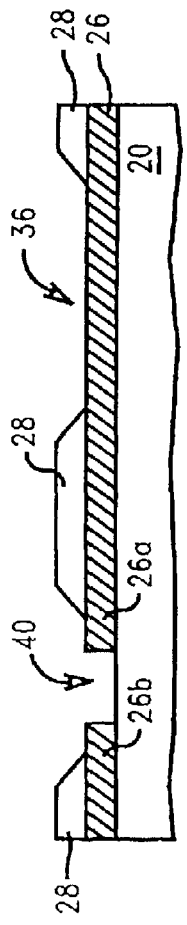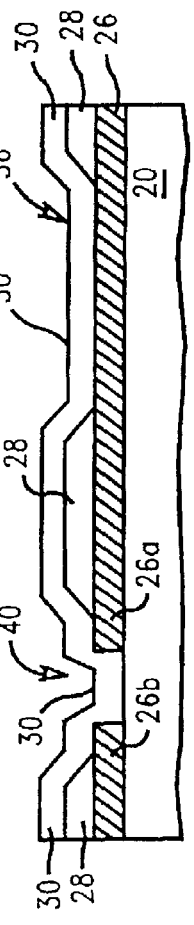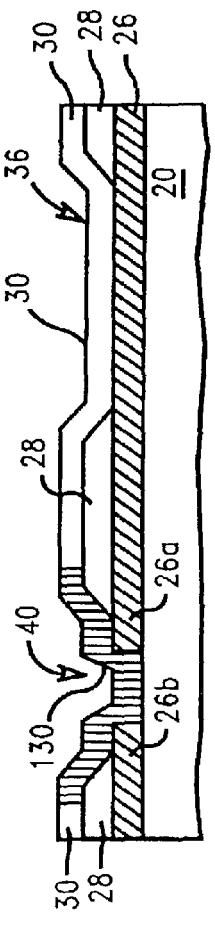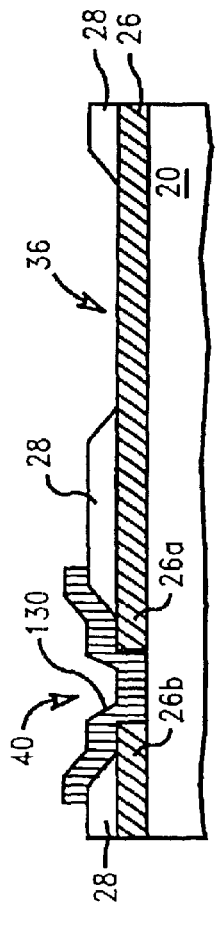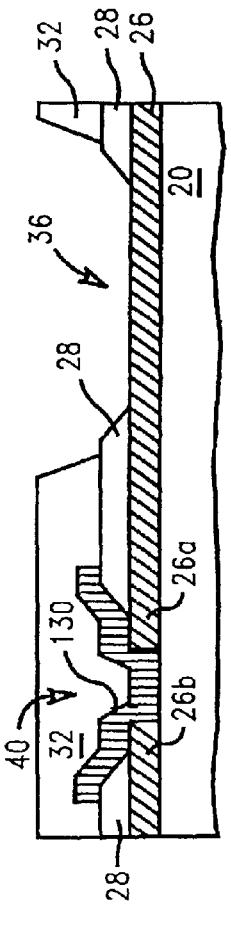

ANTIFUSE FOR USE WITH LOW κ DIELECTRIC FOAM INSULATORS

This is a divisional application of parent application Ser. No. 09/417,853, filed Oct. 14, 1999, now U.S. Pat. No. 6,458,630.

BACKGROUND OF THE INVENTION

1. Field of the Invention

This invention relates to a fuse element used in integrated circuit (IC) devices and, more particularly, to a fuse structure and method of making the fuse which employs a local change in electrical conductivity of a film in contact with metal lines.

2. Description of Related Art

Fuses are used in integrated circuit devices such as semiconductor chips to provide redundancy, electrical chip identification and customization of function. For designs having three or more layers of wiring, the fuses are typically formed from a segment of one of the wiring layers, e.g., the "last metal" or "last metal minus one" wiring layer. Fusing, i.e., deletion of a segment of metal fuse line, is accomplished by exposing the segment to a short, high intensity pulse of "light" from an infra-red laser. The molten metal then boils, vaporizes or explodes out of its oxide surroundings, disrupting line continuity and causing high electrical resistance. A sensing circuit is used to detect fuse segment resistance. Sense circuits can be designed to detect that fusing has occurred when line resistance increases or line resistance decreases.

Critically, the dielectric surrounding the fuse must act much like a pressure vessel, i.e., holding the fuse captive until sufficient pressure is achieved during the superheating phase to cause the fuse link to explode through the weakest wall of the pressure vessel and instantaneously boil away. If pressure is released too soon, the fuse melts and extrudes to the surface through the cracks in the dielectric. Any porous materials in contact with the fuse link will experience compression of the voids with subsequent loss of pressure. If material is a polymer, actual reduction in mass occurs as $T_g$, the glass transition temperature (typically less than 500° C. for polyimide-like materials) is exceeded and the voids are expelled.

Prior art includes U.S. Pat. Nos. 5,523,253 and 5,420,455 to Gilmour et al.; U.S. Pat. No. 5,591,285 to Afzali-Ardakani et al.; U.S. Pat. No. 5,202,061 to Angelopoulos et al.; U.S. Pat. No. 4,590,258 to Linde et al.; U.S. Pat. No. 5,115,095 to Babich et al., U.S. Pat. No. 5,608,257 to Lee et al. and U.S. Pat. No. 5,795,819 to Motsiff et al., all assigned to the assignee of the instant invention. Other art includes U.S. Pat. No. 5,705,849 to Zheng et al., U.S. Pat. No. 5,811,869 to Seyyedy et al., U.S. Pat. No. 5,834,824 to Shepherd et al., U.S. Pat. No. 5,376,502 to Novak et al., U.S. Pat. No. 5,852,323 to Conn, U.S. Pat. No. 5,130,392 to Schwalm et al., U.S. Pat. No. 5,463,014 to Epstein et al., U.S. Pat. No. 5,777,540 to Dedert et al., U.S. Pat. No. 5,663,702 to Shaw, Jr. et al., U.S. Pat. No. 5,855,755 to Murphy et al.

It would be advantageous to eliminate the above described problems by changing the fuse structure and method of making the fuse to avoid the need to physically blow fuses.

Bearing in mind the problems and deficiencies of the prior art, it is therefore an object of the present invention to provide a fuse structure for integrated circuit devices which eliminates the problems of physically blowing fuses.

It is another object of the present invention to provide a method of making such a fuse structure.

A further object of the invention is to provide a method of utilizing a fuse structure in which there is no physical disruption to the fuse.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of programming a device comprising first providing a device having an open circuit comprising a pair of wires having ends thereof separated by a gap. Thereafter a polymer block is formed over the separated ends of the wire. The polymer block is then exposed to an energy beam in order to increase the conductivity of the polymer and electrically connect the wire ends. Preferably, the polymer block comprises a polyimide capable of carbonizing when exposed to an ion or other energy beam for a sufficient time so as to become electrically conductive. More preferably, the polymer block comprises a photoconductive polymer material, and most preferably, the polymer block comprises a polymer/onium salt mixture. By way of example, the polymer block may comprise a polyaniline polymer doped with a triphenylsufonium salt. The method may further comprise providing a low dielectric constant (low k) nanopore/nanofoam dielectric material adjacent the wire ends.

In a related aspect, the present invention provides a method of making a fuse for a semiconductor device comprising initially providing an insulating substrate having a surface. Thereafter, a conductive line pair is formed on the surface of the insulating substrate, the conductive line pair having spaced ends. Finally, there is formed over the insulating substrate and between the conductive line pair ends a layer of a polymer capable of carbonizing when exposed to an ion or other energy beam for a sufficient time so as to become electrically conductive. Preferably, the polymer comprises a polyimide, more preferably, a polymer/onium salt mixture, and most preferably, a polyaniline polymer doped with a triphenylsufonium salt.

The method may further include the step of exposing the polymer in a region between the spaced ends of the conductive line pair to an energy beam to increase the conductivity of the polymer thereby forming a conductive connection between each line of the conductive line pair.

In yet another related aspect, the present invention provides a method of forming an antifuse comprising forming a first conductor in a dielectric layer, forming a second conductor in the dielectric layer and forming a polymer layer over the first and second conductors. Thereafter, the polymer layer is exposed in a region overlapping at least a portion of both the first and second conductors to an energy beam to lower the electrical resistance of the polymer in the region and electrically connect the first and second conductors. Preferably, the dielectric layer comprises a low κ dielectric foam. The polymer layer may comprise a polyimide and the first and second conductors may comprise aluminum or copper.

In another aspect, the present invention provides a fusible link for a semiconductor device comprising an insulating substrate and a conductive line pair on the surface of the insulating substrate, with the conductive line pair having spaced ends. A polymer is disposed over the insulating substrate and between the conductive line pair ends. The polymer is capable of being changed from a non-conductive to a conductive state upon exposure to an energy beam. Preferably, the polymer comprises a polyimide, more preferably, a polymer/onium salt mixture, most preferably, a polyaniline polymer doped with a triphenylsufonium salt. The link may further comprise a low κ nanopore/nanofoam dielectric material adjacent the conductive line ends.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 8-12 are sequential elevational views of the formation of another embodiment of the fuse of the present invention, in which a portion of the carbonizable non-conductive polymer layer is made electrically conductive and the non-conductive portions are removed before the fuse cover layer is applied.

DESCRIPTION OF THE PREFERRED EMBODIMENTS

Figure 1:
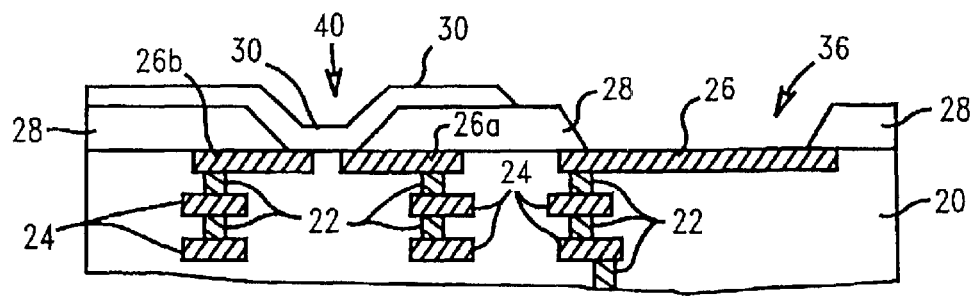
FIG. 1 is an elevational view of a preferred fuse of the present invention.

In describing the preferred embodiment of the present invention, reference will be made herein to FIGS. 1-16 of the drawings in which like numerals refer to like features of the invention. Features of the invention are not necessarily shown to scale in the drawings. Unless otherwise indicated, all references to conductivity, non-conductivity or resistivity are with regard to electrical current.

Increasing integrated circuit performance requires the minimization of the RC time constant associated with the conductor wires in the device. Typically, resistance R is reduced by using copper or other low resistivity metal to form the conductor wires. It has been found that in order to increase speeds of semiconductor devices, the capacitance of the signal lines of the wiring levels must be reduced. The use of dielectric materials having low dielectric constant K accomplishes this. Copper can be used indirectly to reduce capacitance by facilitating smaller wires of the same resistance. However, low κ dielectrics will collapse catastrophically at the energy levels required to laser current blow fuses leading to various reliability if not yield degradation. Also if copper lines are blown by the conventional laser process and left exposed, they easily corrode resulting in reliability exposures.

The dielectric constant is normally about 4.0 for silicon dioxide and about 3.5 for the common polyimide materials. Adding fluorine to either silicon dioxide, e.g. FSG, or polyimide reduces the dielectric constant to 3.0 or less. However, to achieve dielectric constants below about 2.5, air pockets or voids must be added into the insulator film so that the resultant dielectric constant is the net of the dielectric constant of the full density insulator and air. Void containing insulator materials are typically described as nanofoams if they are polymers or nanopores if they are inorganic. In either case, the introduction of voids into the matrix of the insulator material reduces its mechanical strength and modifies other properties such as thermal conductivity. Reduction of mechanical strength compromises the effectiveness of the traditional metal link laser fuse blow process.

The present invention avoids the need to physically blow fuses by utilizing polymers that can be made to become conductive upon exposure to a laser or other energy source, e.g., ion beam. The described structure allows formation of fuses with either polymer or glass low κ dielectric films with minimum impact to the dielectric structure. The invention provides a fuse structure that is compatible with nanopore/nanofoam low dielectric constant insulating films required for advanced integrated circuit devices. Because the fusing metaphor is changed from deleting a segment of metal line via a localized explosion to causing a local change in the conductivity of a film in contact with the metal lines, mechanically fragile and porous insulator films can be used.

The invention is preferably comprised of an array of metal conductor wires such as those that may be found the BEOL (back end of the line) of a silicon integrated circuit device. The wires are preferably surrounded by dielectric films. To achieve minimum wire to wire capacitance, a low κ nanopore/nanofoam dielectric is placed under, over and between the wires. A window is opened in the overlayer dielectric, exposing the surface of the wires to be fused, i.e., electrically connected. At the same time, any required windows for wire bonding or C4 are opened to the appropriate metal pads. A thin layer of, e.g., about 50A to about 1000A, of electrically insulating polymer material capable of carbonizing in an ion, laser or other energy beam, e.g., a polyimide, is deposited over the dielectric. This thin film is imaged to open windows over the medal pads used for wire bond or C4 with conventional lithographic techniques and, if required, cured. Window images need not be opened over the wires to be fused. The cure conditions are such that there is minimum impact to the underlying porous dielectric films.

Selected fuse areas of the completed structure may then be exposed to an ion, laser or other energy beam that increases the local carbon concentration in the thin polymer insulator film, resulting in increased conductivity of the carbonized region, i.e. increased conduction between adjacent metal lines that are in contact with the carbonized part of the film. Areas that are not exposed to the ion, laser or other energy beam do not show increased conductivity. Fuse state, i.e. whether the structure is fused or not fused, is determined either by direct measurement of conduction between wires or by a comparison scheme measuring resistance or capacitance as compared to a reference structure that is never exposed to the ion beam. In this invention, there is no requirement for mechanically robust dielectric films, or high temperature removal of metal line segments, to accomplish fusing.

FIG. 1 is a cross-sectional view of the fuse device of the present invention and a contact pad as fabricated by the method of the invention, which may also be referred to as an antifuse, since the metal wiring layer is initially non-conductive and may be made conductive if desired to program an integrated circuit device in which it is formed. A low k nanopore/nanofoam dielectric substrate 20 contains separate wiring layers 24 of metals such as copper or aluminum connected as desired by electrically conductive vias 22. These wiring layers and vias form the circuitry of the integrated circuit device to be programmed by the fuse of the present invention. A metal contact pad 26 has an area 36 exposed to the surface of the device, and a metal wiring layer has segments 26a, 26b electrically separated by a gap filled with the dielectric 20. Overlying portions of the metal segments 26a, 26b is a low κ nanopore/nanofoam dielectric barrier layer 28. A fuse area 40 is formed by a non-conductive polymer layer 30 which extends over barrier 28 and down to cover the exposed portions of metal layer segments 26a, 26b and the intervening dielectric 20. This polymer layer is capable of carbonizing when exposed to an ion, laser or other energy beam for a sufficient time so as to become electrically conductive.

Figure 2:
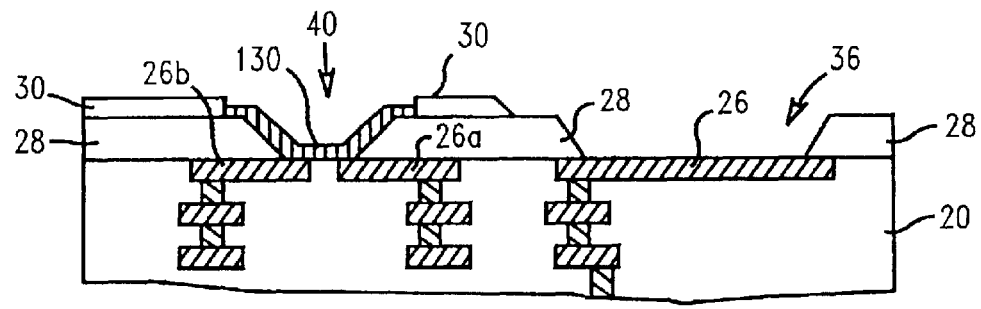
FIG. 2 is an elevational view of the fuse of FIG. 1 after it has been blown to change the fuse area from the non-conductive state to the conductive state.
Figure 3:
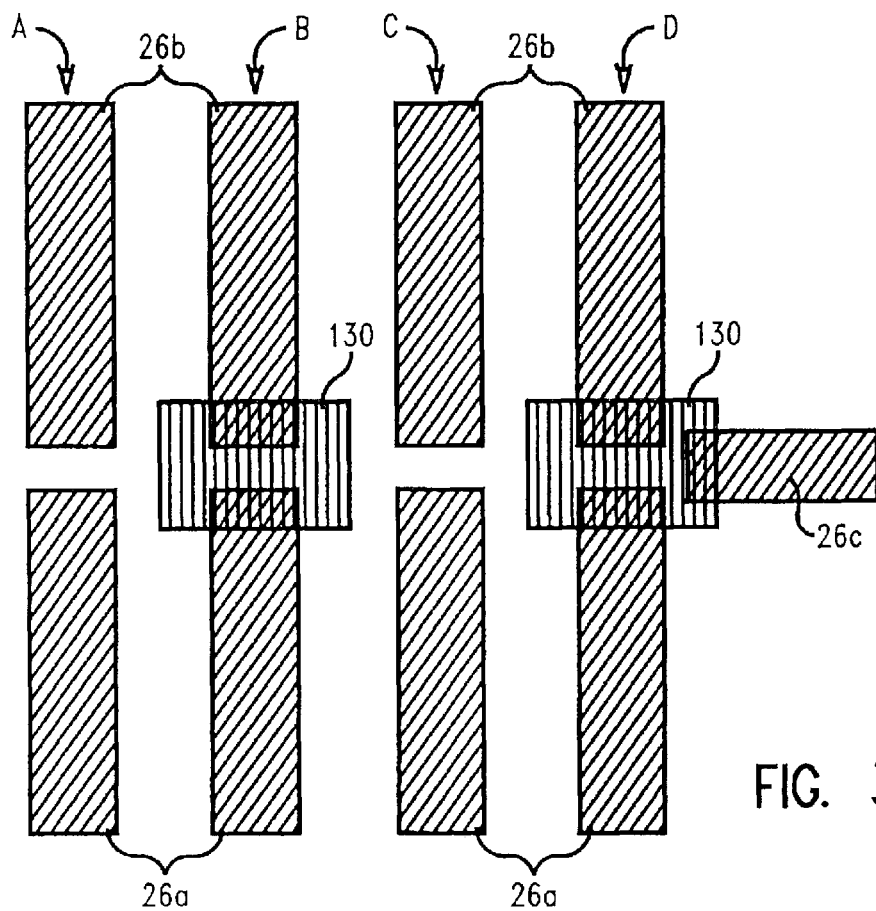
FIG. 3 is a top plan view of fuses made in accordance with the present invention in which some fuses have been blown.

FIG. 2 is a cross-sectional view of the antifuse of FIG. 1 after the antifuse has been exposed to the ion beam and the carbonized polyimide 130 is formed. FIG. 3 is a top view showing several antifuses of the types shown in FIG. 1 in proximity. Fuses A and C are electrically open (non-conducting) between metal segments 26a, 26b. Fuse B has been blown by carbonizing polymer layer 30 to create an electrically conductive, carbonized layer 130 connecting metal segments 26a, 26b. Fuse D has also been blown and electrically connects metal line segments 26a, 26b and 26c.

Figure 4:
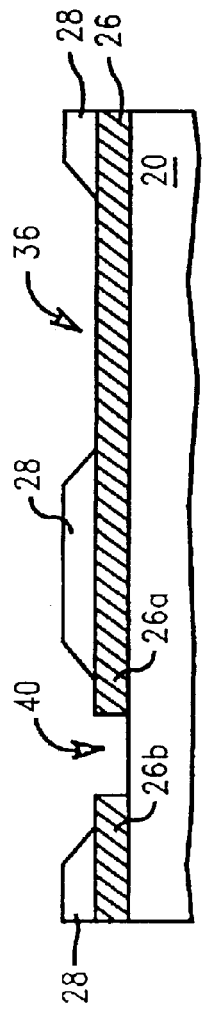
FIGS. 4-7 are sequential elevational views of the formation of one embodiment of the fuse of the present invention, in which a portion of the carbonizable non-conductive polymer layer is made electrically conductive before the fuse cover layer is applied.
Figure 5:
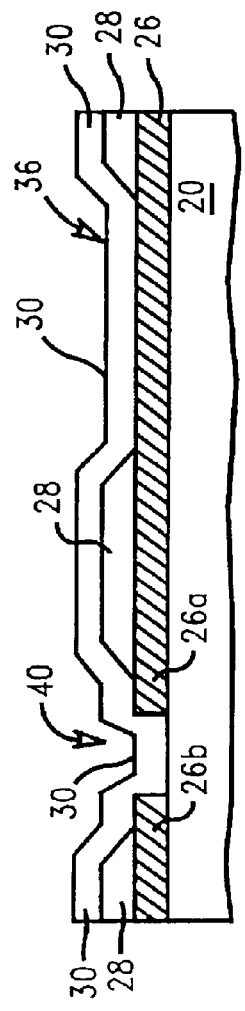
Figure 6:
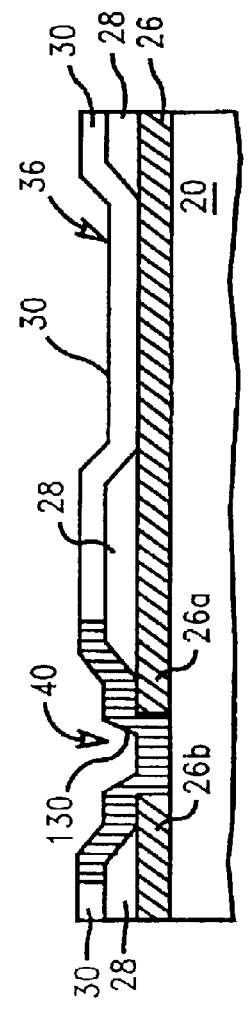
Figure 7:
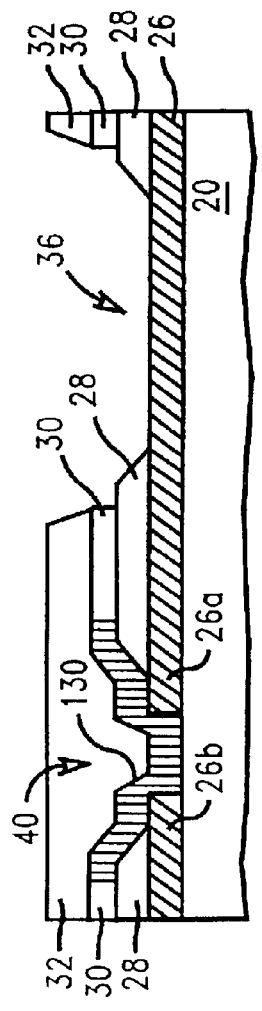

FIGS. 4-7 describe another embodiment of the invention. (Both fuse and pad areas are shown, but the lower wiring layers shown in FIGS. 1 and 2 are omitted in the remaining figures.). In FIG. 4 last metal layer 26 is shown on substrate 20 with passivation layer 28, e.g., oxide and/or nitride, in place. In fuse area 40 a space or gap has been left between the two metal line ends 26a, 26b, with a portion of the line end surfaces exposed, and a horizontally spaced contact pad area 36 is left over layer 26. In FIG. 5 a blanket layer 30 of a polyaniline polymer doped with a triphenylsufonium salt (or other polymer which is capable of being made more electrically conductive by exposure to an energy beam) has been formed, which layer has electrical non-conductivity on the order of 10E10 ohm cm. In FIG. 6, fuse area 40 has been exposed to laser irradiation, which has made the polymer/onium salt conductive 130, on the order of 10 ohm cm In FIG. 7, an overcoat (passivation) layer 32, e.g., a polyimide, has been formed over fuse area 40 and an opening 36 again made over the pad 26 area. The same etchants used for the polyaniline polyimide layer 30 can be used to etch the polyaniline passivation layer 32. Polyaniline dielectric layer 32 has been left in place over fuse area 40 forming a fuse cover layer, along with the underlying portions of the unexposed non-conductive layer 30 on either side of fuse layer 130.

FIGS. 8-12 describe a further embodiment of the invention showing both fuse and pad areas. In FIG. 8 last metal layer 26 is shown on substrate 20 with passivation (oxide/nitride) layer 28 in place, leaving the surfaces of line ends 26a, 26b and pad contact area 36 uncovered, and a space between the line ends in fuse area 40. In FIG. 9 a blanket layer 30 of a polyaniline polymer doped with a triphenylsufonium salt (or other polymer which is capable of being made more electrically conductive by exposure to an energy beam) has been formed. Layer 30 is non-conductive, on the order 10E10 ohm cm, at this point. In FIG. 10 fuse area 40 only has been exposed to laser irradiation, and has made the polymer/onium salt mixture conductive, on the order of 10 ohm cm, as shown by fuse 130. When the polyaniline/triphenylsufonium salt layer 30 is exposed to laser irradiation, not only does it become conductive, but it also becomes insoluble in a suitable solvent, e.g., N-methyl pyrrolidine (NMP). As shown in FIG. 11, all of the unexposed polymer/onium salt mixture of non-conductive blanket layer 30 has been removed by a wet etch in NMP. In FIG. 12 an overcoat layer 32 of a dielectric polyimide has been formed and an opening has again been made over the pad area 36.

Figure 13:
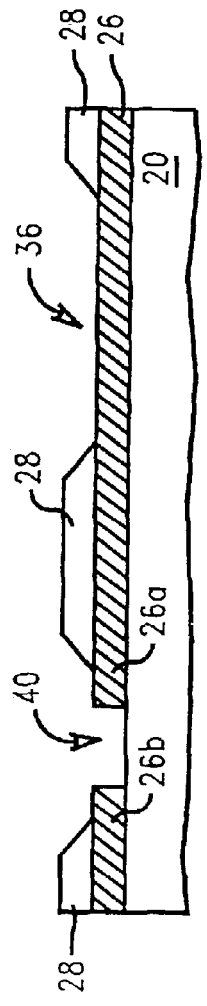
FIGS. 13-16 are sequential elevational views of the formation of another embodiment of the fuse of the present invention, in which a portion of the carbonizable non-conductive polymer layer is made electrically conductive after the fuse cover layer is applied.
Figure 14:
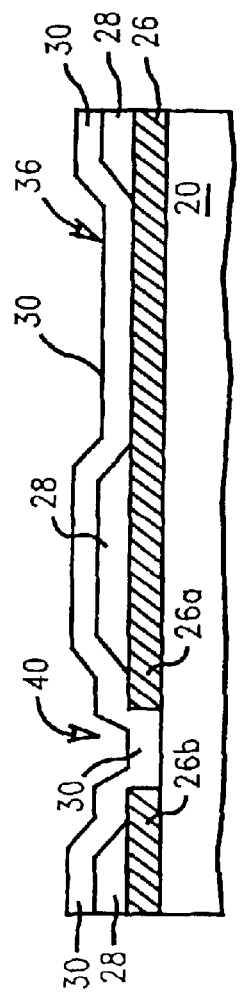
Figure 15:
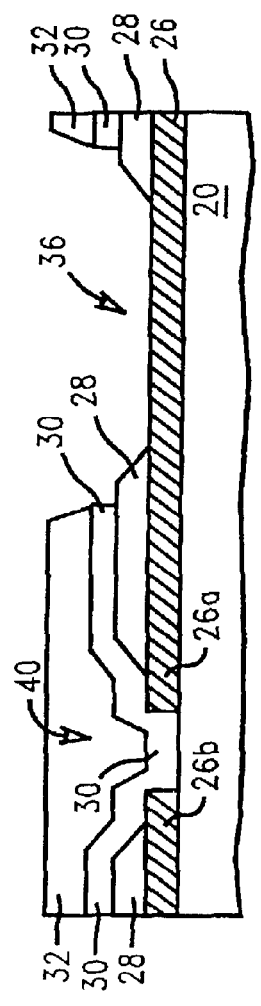
Figure 16:
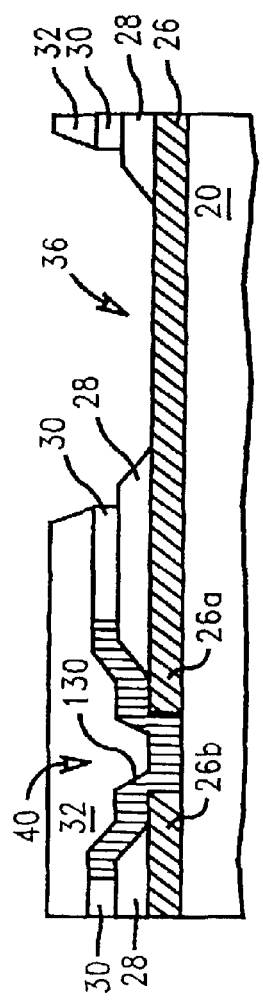

FIGS. 13-16 describe yet another embodiment of the invention showing both fuse and pad areas. In FIG. 13 last metal layer 26 is shown on substrate 20 with passivation (oxide/nitride) layer 28 in place. In fuse area 40 a space has been left between two line ends 26a, 26b, and a portion of the line end surfaces have also been left exposed. In FIG. 14 a blanket layer 30 of a polyaniline polymer doped with a triphenylsufonium salt (or other polymer which is capable of being made more electrically conductive by exposure to an energy beam) has been formed, which layer is non-conductive on the order of 10E10 ohm cm. In FIG. 15 and overcoat layer 32 of a dielectric polyimide has been formed over non-conductive layer 30 and an opening 36 again made over the pad area to expose the surface of metal layer 26. The portion of layer 30 of the polymer/onium salt mixture is also etched when the overcoat layer 32 is etched. In FIG. 16 fuse area 40 has been exposed to laser irradiation through overcoat or fuse cover layer 32 to form a conductive fuse 130 from the polymer/onium salt mixture, on the order of 10 ohm cm.

EXAMPLE

An example of how the fuse structure of the present invention may be formed is provided below.

Initially, a nanopore glass is deposited as the underlayer dielectric. If desired, a thin layer of full density silicon dioxide, silicon nitride, or the like can be deposited as a cap over the nanopore glass layer. Using conventional resist techniques, trenches are etched in the glass to define the wiring pattern, and the resist is then stripped. Using a damascene process, the trenches are filled with one or more metals, e.g. copper, to define the conduction wires. Using chemical mechanical polishing, the unwanted metal is removed from the field areas. A nanopore glass is then deposited as the overcoat dielectric. If desired, a thin layer of full density silicon dioxide, silicon nitride, or the like can be deposited as a barrier under the nanopore glass, and a second thin layer of full density silicon dioxide, silicon nitride, or the like can be deposited as a cap over the nanopore glass.

Using conventional resist and etch techniques, e.g. positive photoresist and a suitable RIE (reactive ion etch), e.g., an etch containing $CF_4/CHF_3$, the fuse windows or areas are opened and the wire bond opening area to the metal pads/lines is created, and the resist is stripped. A thin film of a laser or ion beam-carbonizable polymer such as PMDA-ODA (pyrometallic dianhydride-oxydianline) or other suitable chemistry polyimide is deposited, e.g., by spin application from a dilute solution of the polyimide. Using conventional resist and etch techniques, e.g., positive resist and aqueous alkali, window areas are opened to the wire bond pad. The resist is stripped using a solvent that does not dissolve the polyimide, e.g., n-butyl acetate. The film is then cured by heating in nitrogen to 350° C.

After determining which metal lines need to be connected, i.e., fused, by electrical testing, a focused argon ion beam is used to convert the selected fuse areas to high carbon concentration. By exposing only those regions to the ion beam, the conductivity of the polyimide is increased. Wafer positioning is accomplished within the focused ion beam tool using a precision X-Y stage like that used on step and repeat cameras, and the ion beam parameters are controlled in typical manner, e.g., accelerating voltage or electromagnetic shuttering.

The following tables were determined experimentally and demonstrated the chemical compositional and electrical property changes in the polyimide film after exposure to an ion beam. Electrical resistance changed by a factor of 100.

TABLE 1

| Polyimide Condition | Carbon | Nitrogen | Oxygen |
|---|---|---|---|
| Pristine Polyimide (PMDA-ODA) | 76 | 6 | 17 |
| 300A (SiO2 equiv.) Argon Sputter | 87 | 3 | 9 |
| 650A (SiO2 equiv.) Argon sputter | 89 | 2 | 8 |

Table 1 gives ESCA (electron spectroscopy for chemical analysis) data showing the increase in carbon content of a PMDA-ODA polyimide film after different argon sputter etch times.

TABLE 2

| Polyimide Condition | Electrical Resistance |
|---|---|
| Pristine Polyimide (PMDA-ODA) | 1000E6 ohms@200 u; 5E6@1 u equivalent |
| 650A (SiO2 equiv.) Argon sputter | 10E6 ohms@200 u; 0.05E6@1 u equivalent |

Table 2 gives electrical leakage data, with and without argon sputter etch.

Thus, the present invention provides a fuse structure (or antifuse) in which desired circuits are initially left open in the fuse area. The fuse area may left non-conductive or may be made conductive, if desired, by exposure to an energy beam to program the IC device in the desired manner. The present invention overcomes the limitations of prior art fuse structures and methods of making the fuse and avoids the need to physically blow fuses. The invention also avoids the problem of exposed copper after fuse blow, and allows the use of composite final metals that are otherwise difficult to use as laser fusible links. It allows exotic composite conductors to be used at final metal, because fuse blow is no longer a consideration.

The present invention also solves the problem of fusing for semiconductor chips when low κ organic foams and glasses are used for interlevel dielectrics. The energy to make the fusing polymer film conductive is much lower than that required for melting and then vaporizing metal conductors, which could damage the low κ material.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A fusible link for a semiconductor device comprising:
   an insulating substrate;
   a conductive line pair on said surface of said insulating substrate, said conductive line pair having spaced ends;
   a polymer layer over said insulating substrate and between the conductive line pair ends, said polymer layer being capable of being changed from a non-conductive to a conductive state upon exposure to an energy beam; and
   a conductive region of said polymer layer located between the spaced ends of said conductive line pair forming a conductive connection between each line of said conductive line pair.

2. The link of claim 1 wherein said polymer layer comprises a polyimide.

3. The link of claim 1 wherein said polymer layer comprises a polymer/onium salt mixture.

4. The link of claim 1 wherein said polymer layer comprises a polyaniline polymer doped with a triphenylsufonium salt.

5. The link of claim 1 further comprising a low K nanopore dielectric material adjacent the conductive line ends.

6. The link of claim 5 wherein said low K dielectric nanopore dielectric material has a dielectric constant below about 2.5.

7. The link of claim 1 further comprising a low K nanofoam dielectric material adjacent the conductive line ends.

8. The link of claim 7 wherein said low K dielectric nanofoam dielectric material has a dielectric constant below about 2.5.

9. A fusible link for a semiconductor device comprising:
   an insulating substrate;
   a conductive line pair on said surface of said insulating substrate, said conductive line pair having spaced ends; and
   a polymer/onium salt mixture over said insulating substrate and between the conductive line pair ends, said polymer/onium salt mixture being capable of being changed from a non-conductive to a conductive state upon exposure to an energy beam.

10. The link of claim 9 further comprising a low K nanopore dielectric material adjacent the conductive line ends.

11. The link of claim 10 wherein said low K dielectric nanopore dielectric material has a dielectric constant below about 2.5.

12. The link of claim 9 further comprising a low K nanofoam dielectric material adjacent the conductive line ends.

13. The link of claim 12 wherein said low K dielectric nanofoam dielectric material has a dielectric constant below about 2.5.

14. A fusible link for a semiconductor device comprising:
   an insulating substrate;
   a conductive line pair on said surface of said insulating substrate, said conductive line pair having spaced ends; and
   a polyaniline polymer doped with a triphenylsufonium salt over said insulating substrate and between the conductive line pair ends, said polyaniline polymer being capable of being changed from a non-conductive to a conductive state upon exposure to an energy beam.

15. The link of claim 14 further comprising a low K nanopore dielectric material adjacent the conductive line ends.

16. The link of claim 15 wherein said low K dielectric nanopore dielectric material has a dielectric constant below about 2.5.

17. The link of claim 14 further comprising a low K nanofoam dielectric material adjacent the conductive line ends.

18. The link of claim 17 wherein said low K dielectric nanofoam dielectric material has a dielectric constant below about 2.5.

* * * * *